United States Patent [19]

Lawson et al.

[11] Patent Number: 4,577,948
[45] Date of Patent: Mar. 25, 1986

[54] METHOD AND APPARATUS FOR CONTROLLING THE PROCESSING OF RADIATION SENSITIVE PLATES WITH A LIQUID BY MONITORING THE ELECTRICAL CONDUCTIVITY OF THE LIQUID

[75] Inventors: Leslie E. Lawson, Surbiton; Michael Ingham, Bramley, both of England

[73] Assignee: Vickers PLC, England

[21] Appl. No.: 543,919

[22] Filed: Oct. 20, 1983

[30] Foreign Application Priority Data

Oct. 21, 1982 [GB] United Kingdom ............... 8230105

[51] Int. Cl.⁴ .................. G03D 3/06; G03D 3/08
[52] U.S. Cl. .................. 354/299; 354/320; 354/324; 354/328; 118/689
[58] Field of Search ............. 354/298, 299, 317, 319, 354/320, 321, 322, 324, 325, 328, 297; 355/10, 14 D, 27; 118/689, 690; 137/392; 156/345

[56] References Cited

U.S. PATENT DOCUMENTS

| | | | |
|---|---|---|---|
| 3,515,000 | 6/1970 | Baumoel . | |
| 3,846,818 | 11/1974 | Merz | 354/324 |
| 3,855,861 | 12/1974 | Zimmermann et al. . | |
| 4,240,737 | 12/1980 | Lawson | 354/328 |
| 4,257,347 | 3/1981 | Stahl | 118/689 |
| 4,284,343 | 8/1981 | Junghanns | 354/324 |
| 4,295,913 | 10/1981 | Purr et al. | 354/324 |
| 4,310,238 | 1/1982 | Mochizuki et al. | 355/14 D |

FOREIGN PATENT DOCUMENTS 84097 7/1983 European Pat. Off. .
53-110532 9/1978 Japan .

*Primary Examiner*—A. A. Mathews
*Attorney, Agent, or Firm*—Spensley Horn Jubas & Lubitz

[57] ABSTRACT

Changes occurring in the electrical conductivity of liquids used to process image-wise exposed radiation-sensitive devices are used as a measure of the deterioration in effectiveness of the liquids. This deterioration is compensated for by varying the processing conditions, such as temperature, time, scrubbing action and processing liquid composition, in accordance with the change in conductivity.

9 Claims, 4 Drawing Figures

METHOD AND APPARATUS FOR CONTROLLING THE PROCESSING OF RADIATION SENSITIVE PLATES WITH A LIQUID BY MONITORING THE ELECTRICAL CONDUCTIVITY OF THE LIQUID

This invention relates to the processing of radiation sensitive devices comprising a radiation-sensitive coating on a substrate.

Such radiation sensitive devices are used in the production of, for example, printing plates, in particular lithographic printing plates, printed circuits and integrated circuits. Radiation sensitive devices for use in the production of lithographic printing plates usually consist of a metallic support sheet, which is mechanically or chemically treated to provide a suitable hydrophilic surface and which carries the radiation sensitive coating. In use, the device is image-wise exposed to actinic radiation using either a negative or positive transparency of an appropriate subject. The effect of the actinic radiation is to alter the solubility of the radiation-sensitive coating. The image-wise exposed device is then processed. The processing step involves contacting the image-wise exposed device with a developer to selectively remove unwanted areas of coating from the support sheet to leave an image constituted by the areas of coating remaining on the support sheet. Other types of printing plates and printed and integrated circuits are produced in a similar manner. After the developing step, the device is washed and in the case of a lithographic plate, is treated with a finisher/densitiser whose main purpose is to protect and/or render the non-image areas hydrophilic.

The precise processing routine and processing liquids used, depend on the solubility and chemical characteristics of the radiation sensitive coating being processed. Whilst the processing may be done manually, it is increasingly being carried out in automatic processors.

There are three types of liquid commonly used for developing subtractive coating, namely alkaline developers, solvent developers and aqueous developers. Alkaline developers are used for positive-working coatings based on quinone diazides and consist of an aqueous solution of a suitable alkali, for example a silicate, a phosphate or a hydroxide. Solvent developers are used for negative-working coatings based on photo-cross-linkable materials, for example poly vinyl cinnamate and consist of a suitable solvent, for example a glycol ether or butyrolactone, a surfactant and possibly a mineral acid. Aqueous developers are used for negative working coatings based on diazo resin and consist of an aqueous solution of a surfactant.

A problem arising when processing exposed radiation sensitive devices with developer liquid is that the developer liquid gradually deteriorates with use until it is no longer capable of adequately removing the coating from the support. This deterioration is progressive and, therefore, in the case of a lithographic plate incorrect development can occur well before the developer is completely exhausted.

Also when processing the developed device with finisher/desensitiser liquid, the viscosity of the finisher/desensitiser liquid tends to increase with time because of evaporation. It is important, however, that the finisher/desensitiser liquid is of the correct viscosity. If it is too thin it will not desensitise the non-image areas adequately and if it is too thick it will tend to be applied to the plate unevenly, possibly causing blinding of the image areas.

It has now been discovered that the effectiveness of processing liquids for image-wise exposed radiation sensitive devices such as developer liquids and finisher/desensitiser liquids can be monitored by measuring their electrical conductivities.

According to one aspect of the invention, there is provided a method of processing a plurality of image-wise exposed radiation sensitive devices which method comprises: (i) contacting the devices in turn with a processing liquid; (ii) monitoring the electrical conductivity of the processing liquid during the processing of the devices; and (iii) varying the processing conditions in dependence on changes in electrical conductivity.

According to another aspect of the invention there is provided an apparatus for processing image-wise exposed radiation sensitive devices which apparatus comprises: (i) a container for processing liquid; (ii) a means of moving the devices along a path through the apparatus so that they are contacted by the processing liquid; (iii) a means for measuring the electrical conductivity of the processing liquid and for producing an output signal in dependence on said conductivity; and (iv) a means of varying the processing conditions in dependence on said output signal.

The processing conditions may be varied by, for example, varying the degree to which the devices are processed, and/or varying the temperature of the processing liquid, and/or replenishing or replacing or otherwise varying the composition of the processing liquid. Thus the means of varying the processing conditions may be a means for varying the time degree for which the device is processed by the processing liquid and/or a means for varying the temperature of the processing liquid and/or a means for adding replenisher or other liquid to the processing liquid.

In one embodiment of the apparatus of the invention which is particularly suitable for use in the case where the processing liquid is a developer liquid, said output signal is used to control a motor for driving the device moving means. In this way, the residence time of the device in the apparatus is dependent upon the output signal, ie. upon the conductivity, and therefore the activity of the developer liquid. Thus the degree to which the device is processed is varied as a function of the conductivity of the developer liquid. Additionally, or alternatively, the degree to which the device is processed can be varied by using the output signal to control a motor for driving a roller arranged to agitate the developer liquid in contact with the device so that the speed of rotation of the roller is dependent upon the output signal, ie. upon the developer activity.

In a further embodiment, the apparatus includes a heating and cooling unit for varying the temperature of the processing liquid in dependence on the output signal.

In yet a further embodiment, the apparatus includes a reservoir for containing processing liquid replenisher, ie. the same, a different or a more concentrated solution, the flow of replenisher to the main body of processing liquid in the apparatus being controlled by the output signal by means of, for example, a solenoid valve.

In the case where a processing liquid does not have sufficiently high conductivity, a lithographically inert material which ionises in solution, eg. potassium nitrate, may be added to it.

For a better understanding of the invention and to show how the same may be carried into effect, reference will now be made, by way of example, to the accompanying drawings, in which.

Figure 1:
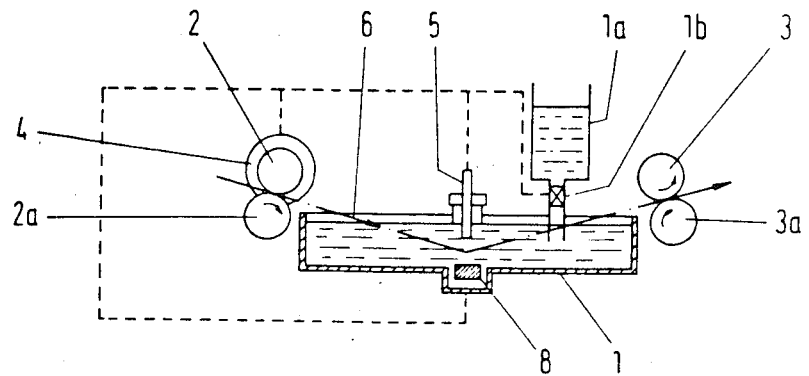
FIG. 1 is a schematic diagram of an apparatus in accordance with the present invention.

Referring to FIG. 1 the apparatus comprises a tank 1 for containing developer liquid, a pair of rubber covered input rollers 2 and 2a, a pair of rubber covered output rollers 3 and 3a, and a variable speed dc electric motor 4 connected to drive the roller 2. Roller 2a is driven by contact with roller 2. (The rollers, 3, 3a may also be driven from the motor 4 if desired). A conductivity cell 5 is mounted in the tank 1 so as to lie in the developer liquid. A reservoir 1a for storing developer replenisher is mounted on the tank 1. A heater/cooler unit 8 may also be provided.

Figure 2:
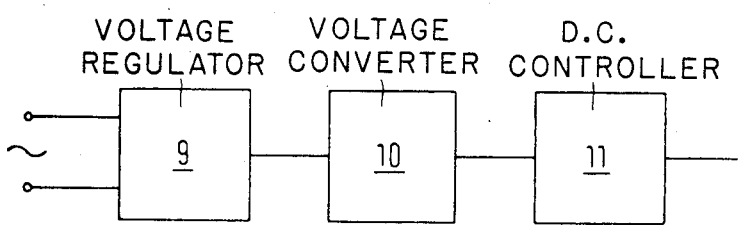
FIG. 2 is a block diagram of the control circuit of the apparatus of FIG. 1.

Referring to FIG. 2, the electrical control circuit consists of a constant voltage source 9 in the form of an integrated circuit voltage regulator, a voltage converter 10 incorporating the conductivity cell and a servo-device 11 in the form of a dc thyristor controller, the output of which has a control function.

Figure 3:
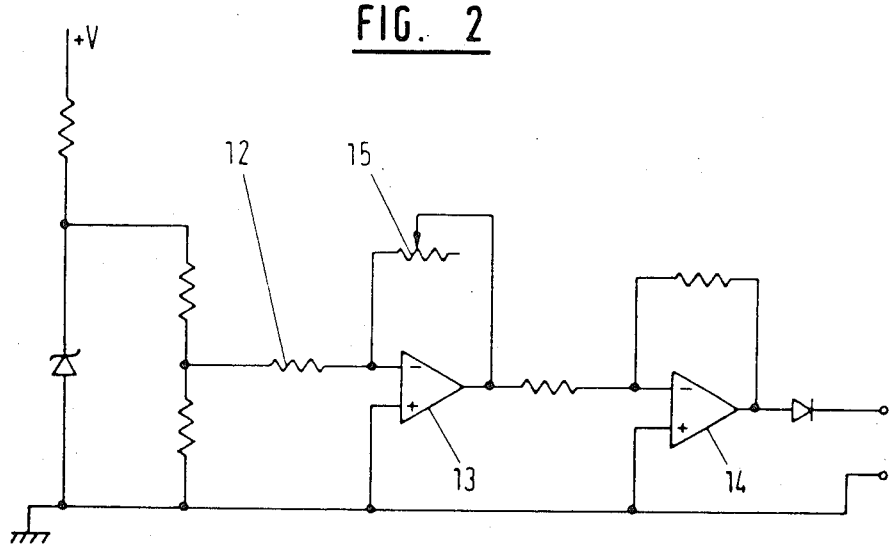
FIG. 3 is a circuit diagram of a part of the control circuit shown in FIG. 2.

As shown in FIG. 3, the regulated voltage from the source 9 is fed through the conductivity cell 12 to a pair of dc amplifiers 13 and 14. Variation in the conductivity of the developer produces a change in the input voltage to the amplifier 13. The output of the amplifier 14 is connected to the servo device 11. A variable resistor 15 is provided to vary the gain of the amplifier 13.

In use, image-wise exposed radiation sensitive devices are fed in succession into the input rollers 2 and 2a which move the same along path 6 through the apparatus and then out of the apparatus via output rollers 3 and 3a. During passage along the path 6, the devices are submerged in the developer in tank 1 whereby the more soluble areas of the image-wise exposed radiation sensitive coating of the devices are selectively removed. Depending on the conductivity of the developer, the output signal from the servo device can be used to vary the speed of the motor 4, vary the temperature of the developer by actuating the heater/cooler unit, and/or operate a control valve 1b on the replenisher reservoir.

Clearly, the conductivity parameters of one type of developer liquid may not be the same as another type. Suitable alteration of the measurement range may be obtained by adjusting the potentiometer 15.

Figure 4:
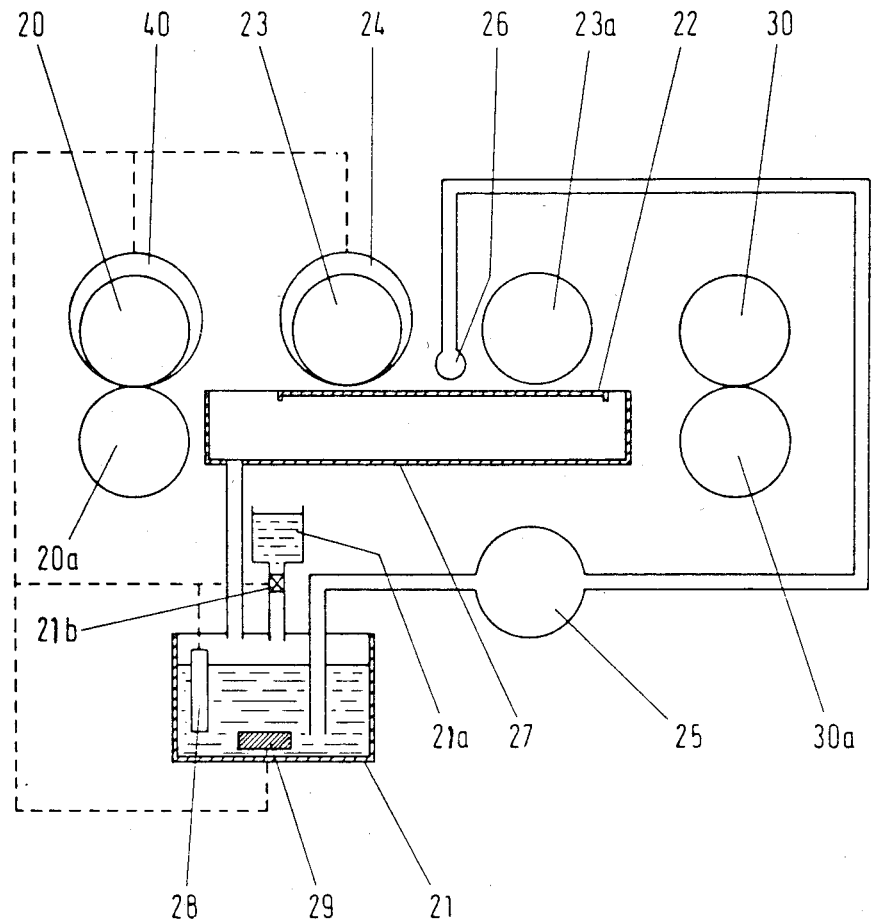
FIG. 4 is a schematic diagram of another apparatus in accordance with the present invention.

Referring to FIG. 4, the apparatus includes a pair of rubber covered input rollers 20 and 20a, a pair of rubber covered output rollers 30 and 30a, and a variable speed dc electric motor 40 for driving the rollers 20 and 20a. The apparatus includes a separate reservoir 21 for developer liquid and a pump 25 for delivering developer liquid to a spray bar 26 located between a pair of plush covered agitator rollers 23 and 23a driven by a separate variable speed motor 24. A planar member 22 is located under the rollers 23 and 23a and bar 26 and a catch tray 27 is provided to return processing liquid to the reservoir 21. A storage reservoir 21a is provided for developer replenisher. A heater/cooler unit 29 is provided in the reservoir 21.

The apparatus includes a conductivity cell 28 similar to that of the apparatus of FIG. 1 and this is preferably located in the reservoir 21 as shown. The apparatus also includes an electrical control circuit of the type shown in FIGS. 2 and 3 and the output from the servo device of the circuit is fed to motor 40 and/or motor 24, and/or the heater/cooler unit 29, and/or a control valve 21b in the reservoir 21a. In use, an image-wise exposed radiation sensitive device is fed face upwards along a path between the input rollers 20 and 20a, between the rollers 23 and 23a and the member 22, and then between the output rollers 30 and 30a. The exposed radiation sensitive coating of the device is contacted by the rollers 23 and 23a and development is carried out by a combined scrubbing and solvent action.

The degree to which the device is processed (ie. its residence time in the apparatus and/or the extent to which the developer liquid is agitated in contact with the device by the roller 23) and/or the strength of the developer liquid are controlled in dependence on the variation in the conductivity of the developer liquid during processing.

The following examples illustrate the invention.

EXAMPLE 1

A processor of the type shown in FIG. 1 was filled with developer liquid consisting of an aqueous solution containing sodium metasilicate, disodium phosphate and a surfactant at 22 degC.

A number of positive working presensitised plates each consisting of a grained and anodised aluminium substrate coated with a radiation sensitive mixture of a naphthoquinone diazide sulphonic acid ester and a novolak resin, was exposed to UV light beneath a continuous tone step-wedge and a Fogra Precision Measuring strip PMS1.

The plates were passed through the processor. The conductivity was monitored using a conductivity meter having a full scale deflection of 60,000 microsiemens/cm. A note was made of the step-wedge and PMS1 readings for each decrease in conductivity of 1,000 microsiemens.

The results were as follows:

| Conductivity (Microsiemens/cm) | Step-wedge clear/solid | PMS1 A | PMS1 B |
|---|---|---|---|
| 50,000 | 3/9 | 8 | 8 |
| 49,000 | 3/9 | 8 | 8 |
| 48,000 | 3/9 | 8 | 8 |
| 47,000 | 3/9 | 8 | 8 |
| 46,000 | 3/8 | 8 | 8 |
| 45,000 | 3/7 | 10 | 8 |
| 44,000 | 2/7 | 10 | 6 |
| 43,000 | 2/6 | 10 | 6 |
| 42,000 | 2/6 | 10 | 6 |

The processor was refilled with fresh developer and further plates processed until the conductivity had dropped to 45,000 microsiemens. The developer was then heated until the conductivity was again 50,000 microsiemens. A further plate was processed and gave step-wedge and PMS1 readings of 3/9 and 8,8 respectively.

The developer was cooled to 22 degC. (conductivity 45,000 microsiemens). Further plates were processed at successively slower speeds until readings of 3/9 and 8,8 were obtained. It was found that a plate had to be given 50% greater development time.

Finally, developer replenisher was added to the processor to bring the conductivity back to 50,000 microsiemens whereupon a plate passed through the processor again gave readings of 3/9 and 8,8.

EXAMPLE 2

Example 1 was repeated except that the developer consisted of an aqueous solution containing sodium hydroxide, and a surfactant. The original conductivity was 60,000 microsiemens/cm and gave step-wedge and PMSI readings of 3/9 and 8.8 respectively. The conductivity of effectively exhausted developer was 50,000 microsiemens/cm (step-wedge 3.7, PMSI 10.8). The developer was heated until the conductivity was 60,000 microsiemens/cm which restored the step-wedge and PMSI readings.

On cooling the developer until the conductivity was 50,000 microsiemens/cm, a plate had to be given a 45% greater development time to produce the correct readings.

A plate developed with developer replenished to 60,000 again gave the same readings of 3/9 and 8.8.

EXAMPLE 3

A number of plates were exposed and developed in accordance with Example 1 of GB Pat. No. 1591988 to produce so called screenless or continuous tone plates. The conductivity of the developer initially was 32,000 microsiemen/cm and the initially developed plate had a density of 1.65. After a number of plates had been processed, the conductivity had dropped to 25,000 microsiemens/cm and the density range produced was only 1.3.

Heating the developer until the conductivity was again 32,000 microsiemens/cm restored the density range of 1.65. Cooled developer (conductivity 25 microsiemens/cm) required 55% extra development time. The density range of 1.65 could be regained by replenishing the developer back to a conductivity of 32,000 microsiemens/cm.

EXAMPLE 4

The reservoir of a processor of the type shown in FIG. 4 was filled with an aqueous developer consisting of an aqueous solution containing a surfactant, sodium benzoate and sodium octanoate. The conductivity of the fresh developer was 24,500 microsiemens/cm. Unexposed plates having a diazo resin coating were passed through the processor and the conductivity was continuously monitored until the plates showed signs of scumming when inked-in. The conductivity of the developer was then 15,200 microsiemens/cm. Further plates were processed at successively slower speeds and it was found that 35% more development time had to be given to produce clean plates.

EXAMPLE 5

This example deals with solvent developers which deteriorate mainly due to contamination with water from the atmosphere.

A processor of the same type as used in Example 4, was filled with a developer consisting of 2-methoxy ethyl acetate, a surfactant and phosphoric acid. The conductivity of the developer was 14.1 microsiemens/cm. To simulate contamination, water was added in amounts of 0.5% and the conductivity was monitored whilst unexposed plates having a coating based on poly vinyl cinnamate were passed through the processor. At a water content of 6%, the conductivity was 46.5 microsiemens/cm and the developed plates showed signs of scumming. Further plates were processed at successively slower speeds and it was found that 40% more development time had to be given to produce clean plates.

EXAMPLE 6

Samples of finisher liquids based on an aqueous solution containing starch and surfactant and suitable for negative-working plates were made up so as to be of normal strength, 20% and 50% overstrength and 50% and 75% understrength. The conductivity of the samples, at 22 degC. were as follows:

| 50% overstrength | 7,500 microsiemens/cm |
| 20% overstrength | 6,500 microsiemens/cm |
| Normal | 5,600 microsiemens/cm |
| 50% understrength | 3,500 microsiemens/cm |
| 75% understrength | 2,300 microsiemens/cm |

The samples were used to process exposed and developed negative-working plates. Plates treated with the overstrength solutions showed a tendency for the image areas to blind and plates treated with the under strength solutions showed a tendency for the non-image areas to scum. By monitoring the conductivity and altering the concentration of the finisher liquid accordingly, satisfactory processing of the plates could be achieved.

EXAMPLE 7

Example 6 was repeated using samples of a finisher comprising an aqueous solution of gum arabic. However, the conductivity was too low to be significant. To each sample there was added 0.2% by weight of potassium nitrate. The conductivity readings were then as follows:

| 50% overstrength | 6,000 microsiemens/cm |
| 20% overstrength | 5,000 microsiemens/cm |
| Normal | 4,400 microsiemens/cm |
| 50% understrength | 3,500 microsiemens/cm |
| 75% understrength | 3,000 microsiemens/cm |

The samples were used to process the plates developed in Example 1. Again, the plates treated with the overstrength solutions showed a tendency to blind and plates treated with the understrength solutions showed a tendency to scum.

EXAMPLE 8

Example 6 was repeated using samples of a finisher designed to protect the non-image areas of a lithographic plate during an image hardening baking process, the finisher comprising an aqueous solution of a sodium dodecylated oxidibenzene disulphonate and sodium citrate.

The conductivity readings were as follows:

| 50% overstrength | 57,000 microsiemens/cm |
| 20% overstrength | 55,500 microsiemens/cm |
| Normal | 52,000 microsiemens/cm |
| 50% understrength | 41,500 microsiemens/cm |
| 75% understrength | 37,200 microsiemens/cm |

The samples were used to treat the type of plates used in Example 1, and the treated plates were baked at 220 degC. for 10 minutes. It was found that there was no apparent effect using the overstrength samples, but that the understrength samples failed to protect the non-image areas which scummed badly.

We claim:

1. An apparatus for processing image-wise exposed radiation sensitive plates which apparatus comprises
   (i) a container for processing liquid,
   (ii) a means of moving the plates along a path through the apparatus so that they are contacted by the processing liquid under given processing conditions,
   (iii) a means for measuring the electrical conductivity of the processing liquid and for producing an output signal in dependence on said conductivity, and
   (iv) a means of varying the processing conditions in dependence on said output signal
   wherein said means of varying the processing conditions includes a variable speed motor for driving the plate moving means and controlled by said output signal so that the period of time for which the plates are in contact with the processing liquid is dependent on the conductivity.

2. An apparatus as claimed in claim 1 wherein said means of varying the processing conditions includes a reservoir for storing further liquid and having a valve to enable the further liquid to be fed to the container, the valve being controlled by said output signal so that further liquid is added to the processing liquid in the container in dependence on the conductivity.

3. An apparatus for processing image-wise exposed radiation sensitive plates which apparatus comprises
   (i) a container for processing liquid,
   (ii) a means of moving the plates along a path through the apparatus so that they are contacted by the processing liquid under given processing conditions,
   (iii) a means for measuring the electrical conductivity of the processing liquid and for producing an output signal in dependence on said conductivity, and
   (iv) a means of varying the processing conditions in dependence on said output signal
   wherein said means of varying the processing conditions includes a variable speed motor for driving an agitating roller for agitating processing liquid in contact with the plates, the variable speed motor being controlled by said output signal so that the degree to which the processing liquid is agitated in contact with the plates is dependent on the conductivity.

4. An apparatus for processing image-wise exposed radiation sensitive plates which apparatus comprises
   (i) a container for processing liquid,
   (ii) a means of moving the plates along a path through the apparatus so that they are contacted by the processing liquid under given processing conditions,
   (iii) a means for measuring the electrical conductivity of the processing liquid and for producing an output signal in dependence on said conductivity, and
   (iv) a means of varying the processing conditions in dependence on said output signal
   wherein said means of varying the processing conditions includes a unit immersed in the processing liquid to vary the temperature thereof, said unit being controlled by said output signal so that the temperature of the processing liquid is dependent on the conductivity.

5. A method of processing a plurality of image-wise exposed radiation sensitive plates each comprising a substrate carrying an image-wise exposed radiation sensitive coating which method comprises: (i) moving the plates along a path through a developer liquid to selectively remove unwanted coating from the substrate to leave an image constituted by the areas of coating remaining on the substrate, (ii) monitoring the electrical conductivity of the developer liquid during the processing of the plates, and (iii) varying the time for which the plates are in contact with the developer liquid in dependence on changes in the electrical conductivity.

6. A method as claimed in claim 5 and additionally comprising the step of adding further liquid to the developer liquid in dependence on the changes in electrical conductivity.

7. A method as claimed in claim 5 wherein the developer liquid includes a lithographically inert material which ionises in solution to increase the electrical conductivity.

8. A method of processing a plurality of image-wise exposed radiation sensitive plates each comprising a substrate carrying an image-wise exposed radiation sensitive coating which method comprises: (i) contacting the plates in turn with a developer liquid to selectively remove unwanted coating from the substrate to leave an image constituted by the areas of coating remaining on the substrate, (ii) agitating the developer liquid in contact with the plates, (iii) monitoring the electrical conductivity of the developer liquid during the processing of the plates, and (iv) varying the degree to which the developer liquid is agitated in dependence on changes in the electrical conductivity.

9. A method of processing a plurality of image-wise exposed radiation sensitive plates each comprising a substrate carrying an image-wise exposed radiation sensitive coating which method comprises: (i) contacting the plates in turn with a developer liquid to selectively remove unwanted coating from the substrate to leave an image constituted by the areas of coating remaining on the substrate, (ii) monitoring the electrical conductivity of the developer liquid during the processing of the plates, and (iii) varying the temperature of the developer liquid in dependence on changes in the electrical conductivity.

* * * * *